United States Patent
Kawasaki et al.

(10) Patent No.: US 10,096,448 B2
(45) Date of Patent: Oct. 9, 2018

(54) SPHERICAL ABERRATION CORRECTOR FOR ELECTROMAGNETIC LENS FOR CHARGED PARTICLE BEAM

(71) Applicant: NATIONAL UNIVERSITY CORPORATION NAGOYA UNIVERSITY, Nagoya-shi, Aichi (JP)

(72) Inventors: Tadahiro Kawasaki, Nagoya (JP); Takayoshi Tanji, Nagoya (JP); Takashi Ikuta, Neyagawa (JP)

(73) Assignee: NATIONAL UNIVERSITY CORPORATION NAGOYA UNIVERSITY, Nagoya-shi (JP)

( * ) Notice: Subject to any disclaimer, the term of this patent is extended or adjusted under 35 U.S.C. 154(b) by 0 days.

(21) Appl. No.: 15/559,967

(22) PCT Filed: Feb. 8, 2016

(86) PCT No.: PCT/JP2016/053691
§ 371 (c)(1),
(2) Date: Sep. 20, 2017

(87) PCT Pub. No.: WO2016/174891
PCT Pub. Date: Nov. 3, 2016

(65) Prior Publication Data
US 2018/0114670 A1    Apr. 26, 2018

(30) Foreign Application Priority Data
Apr. 27, 2015   (JP) .................. 2015-090241

(51) Int. Cl.
*H01J 37/14*   (2006.01)
*H01J 37/153*   (2006.01)
*H01J 37/145*   (2006.01)

(52) U.S. Cl.
CPC .......... *H01J 37/153* (2013.01); *H01J 37/145* (2013.01)

(58) Field of Classification Search
CPC ........ H01J 37/141; H01J 37/153; H01J 37/14; H01J 37/12; H01J 37/10; H01J 37/04; H01J 37/00
(Continued)

(56) References Cited

U.S. PATENT DOCUMENTS 3,566,176  A   2/1971  Kasper
6,605,810  B1  8/2003  Haider et al.
(Continued)

FOREIGN PATENT DOCUMENTS

GB   2 352 323  A   1/2001
GB   2 369 241  A   5/2002
(Continued)

OTHER PUBLICATIONS

Apr. 19, 2016 Written Opinion Issued in International Patent Application No. PCT/JP2016/053691.
(Continued)

*Primary Examiner* — Nicole Ippolito
*Assistant Examiner* — Hanway Chang
(74) *Attorney, Agent, or Firm* — Oliff PLC

(57) ABSTRACT

An electromagnetic lens for charged particle beam exhibits positive spherical aberration. A complicated combination of electromagnetic lenses had been necessary for correcting this spherical aberration. One of a circular aperture or a ring-shaped aperture is provided on an incident plate arranged on an incident side of charged particle beam, another of the circular aperture or the ring-shaped aperture is provided on a plate arranged on an emission side thereof, and a voltage is applied between the incident plate and the emission plate. By so doing, an electric field generated in the
(Continued)

ring-shaped aperture emanates, which resolves the positive spherical aberration. The spherical aberration can be corrected by an extremely simple and easily implemented structure.

10 Claims, 12 Drawing Sheets

(58) Field of Classification Search
USPC .................................. 250/306, 307, 310, 311
See application file for complete search history.

(56) References Cited

U.S. PATENT DOCUMENTS

| 2008/0116391 A1 | 5/2008 | Ito et al. |
| 2009/0032709 A1 | 2/2009 | Sawada |

FOREIGN PATENT DOCUMENTS

| JP | 2001-052998 A | 2/2001 |
| JP | 2002-510431 A | 4/2002 |
| JP | 2008-153209 A | 7/2008 |
| JP | 2009-054565 A | 3/2009 |
| JP | 2012-227160 A | 11/2012 |

OTHER PUBLICATIONS

Apr. 19, 2016 Search Report Issued in International Patent Application No. PCT/JP2016/053691.

P.W. Hawkes. "Aberration Correction Past and Present" Phil. Trans. R. Soc. A (2009) 367, 3637-3664.

F. Lenz et. al., "Electron Optical Systems With Annular Apertures and With Corrected Spherical Aberration" Optik 24, Heft 5 1966/1967, pp. 383-396.

(1)

(2)

(3)

(4)

(1)

(2)

SPHERICAL ABERRATION CORRECTOR FOR ELECTROMAGNETIC LENS FOR CHARGED PARTICLE BEAM

TECHNICAL FIELD

The present description discloses a corrector of spherical aberration that is generated when charged particle beam is converged by an electromagnetic lens.

BACKGROUND ART

For example, in a scanning electron microscope, electron beam is converged by an object lens, and this converged electron beam is radiated onto a sample. In a transmission electron microscope, a sample is observed by an image formed by converging electron beam that had passed through the sample. Also in a device that radiates beam constituted of charged particles such as ions onto a sample, the charged particle beam is converged by an electromagnetic lens, and the converged charged particle beam is radiated onto the sample.

A lens that converges the charged particle beam brings positive spherical aberration (aberration to forth side). To improve resolution, the spherical aberration needs to be corrected.

Spherical aberration described herein refers to those brought forth by an electromagnetic lens that converges charged particle beam. The electromagnetic lens that converges the charged particle beam may be exemplified by an object lens, a condenser lens, a projection lens, and combinations of these lenses. A corrector described herein may for example be used for correcting spherical aberration of an object lens in cases where the spherical aberration of the object lens is at issue; in cases where spherical aberration of a combination of a condenser lens and an object lens is at issue, it may be used for correcting spherical aberration generated by this combination; and in cases where spherical aberration of a combination of an object lens and a projection lens is at issue, it may be used for correcting spherical aberration generated by this combination. An electromagnetic lens that can be used in combination with the corrector disclosed herein is not particularly limited, and it refers to an electromagnetic lens or a combination of electromagnetic lenses that exhibit spherical aberration upon converging charged particle beam.

Spherical aberration correctors as mentioned above are described in Patent Literatures 1 to 4 and Non-Patent Literature 1.

CITATION LIST

Patent Literature

Patent Literature 1: JP 2002-510431 A
Patent Literature 2: JP 2009-54565 A
Patent Literature 3: U.S. Pat. No. 3,566,176 B
Patent Literature 4: JP 2012-227160 A

Non-Patent Literature

Non-Patent Literature 1: Electron Optical Systems with Annular Apertures and with Corrected Spherical Aberration, F. Lenz et. al DK621.385.833:537.533 Optik '24 Heft 5, 1966/1967

SUMMARY OF INVENTION

Technical Problem

The spherical aberration correctors described in Patent Literatures 1 and 2 have complicated structures, are large-sized, and are expensive. For example, if they are to be applied to an electron microscope, modification may be necessary to the electron microscope itself.

As shown schematically in FIG. 13(1), the spherical aberration corrector of Non-Patent Literature 1 inserts a circular column-shaped electrode into a circular aperture of an electrode provided with the circular aperture, and a potential difference is given to these two members. Non-Patent Literature 1 presents a calculation result asserting that spherical aberration can be corrected by this configuration. Patent Literature 4 also describes a device shown in FIG. 13(1), and it applies a potential difference between a circular column-shaped electrode (hereinbelow referred to as an inner electrode) and an electrode provided with a circular aperture (hereinbelow referred to as an outer electrode).

In the techniques of Non-Patent Literature 1 and Patent Literature 4, a center of the circular aperture and a center of the circular column need to be aligned coaxial, they need to be insulated, and the potential difference needs to be applied therebetween. It is therefore difficult to actually produce this device.

For example, FIG. 13(2) exemplifies a virtual structure that provides a bridge between the outer electrode and the inner electrode to maintain coaxiality thereof. In this case, if the outer electrode, the inner electrode, and an entirety of the bridge constitute an integrated object, it can actually be produced by fine cutting processing or the like. However, with such a structure, the potential difference cannot be applied between the outer electrode and the inner electrode. It is difficult to actually produce a structure that maintains the outer electrode and the inner electrode coaxial while insulating them from one another. Patent Literature 4 employs a structure in which the inner electrode and the outer electrode are fixed to a preformed support, and the potential difference is applied by providing wirings that reach the inner electrode, however, it is difficult to produce this structure accurately, and great amount of cost becomes necessary to increase production accuracy. The present invention makes a progress over such concept of applying a potential difference between an outer electrode and an inner electrode insulated in a state of being maintained coaxial, and proposes a spherical aberration corrector that can be produced at low cost.

In the spherical aberration corrector of Patent Literature 3, two electrodes in each of which a ring-shaped aperture is provided are arranged coaxially on a center line of electron beam. In the technique of Patent Literature 3 as well, a potential difference is applied between an outer portion and an inner portion of each ring-shaped aperture. The technique of Patent Literature 3 describes a structure in which the inner portion and the outer portion of each ring-shaped aperture are connected by bridge-shaped connectors to define the ring-shaped aperture. The technique of Patent Literature 3 needs to connect the outer portion and the inner portion while providing insulation therebetween, however, details on how this insulation is provided is not described. Same problem as Non-Patent Literature 1 and Patent Literature 4 becomes the issue in implementing the corrector of Patent Literature 3.

Non-Patent Literature 1 and Patent Literatures 3 and 4 disclose structures that seem simple at first glance, however, they all use an electric field generated by the application of the potential difference between the outer portions and the inner portions of the ring-shaped apertures, and the actual production thereof is difficult. Actual implementation requires a new concept that is different from the concept of applying a potential difference between an outer portion and an inner portion of a ring-shaped aperture.

The description herein discloses a corrector configured to correct spherical aberration without application of a potential difference between an outer portion and an inner portion of a ring-shaped aperture (which is in other words, in a state where the outer portion and the inner portion of the ring-shaped aperture are at a same potential). If the outer portion and the inner portion of the ring-shaped aperture can be at the same potential, electrodes provided with the ring-shaped aperture can be produced by using a converged ion beam method or the like to be described later.

Technical Solution

A corrector disclosed herein is used in combination with an electromagnetic lens for charged particle beam, and is configured to correct spherical aberration generated by the electromagnetic lens. This corrector comprises: an incident plate arranged on an incident side of the charged particle beam; and an emission plate arranged on an emission side of the charged particle beam. One of a circular aperture and a ring-shaped aperture is provided on the incident plate, and another of the circular aperture and the ring-shaped aperture is provided on the emission plate. That is, this corrector uses a combination of the circular aperture and the ring-shaped aperture. An order by which the circular aperture and the ring-shaped aperture are arranged is not limited, and the circular aperture may be on an upstream side (incident side), or the ring-shaped aperture may be on the upstream side.

The two plates satisfy the following relationships:

(1) centers of the circular aperture and the ring-shaped aperture are on a center line of the charged particle beam, (2) the incident plate and the emission plate intersect perpendicularly to the center line, (3) $\varphi 3 \geq \varphi 2 > \varphi 1$ is satisfied, where a diameter of the circular aperture is $\varphi 3$, an outer diameter of the ring-shaped aperture is $\varphi 2$, and an inner diameter of the ring-shaped aperture is $\varphi 1$, and (4) a relationship of "a potential of a plate on which the ring-shaped aperture is provided>a potential of a plate on which the circular aperture is provided" is satisfied when charged particles are of negative charge, and a relationship of "the potential of the plate on which the ring-shaped aperture is provided<the potential of the plate on which the circular aperture is provided" is satisfied when the charged particles are of positive charge. An inner portion and an outer portion of the ring-shaped aperture are configured to be electrically conducted, and are set to a same potential.

In a case of a scanning electron microscope, a progressing direction of electron beam is scanned by a deflection coil. However, a scannable range thereof is very small, and a deflection angle thereof is very small "On a center line" described in (1) and "intersect perpendicularly" described in (2) do not take very small deflection angles into account, and they refer to an accuracy level required for mechanical parts arrangement work.

With the aforementioned corrector, no potential difference is applied between an inner portion and an outer portion of the ring-shaped aperture. Instead, a potential difference is applied between the plate on which the ring-shaped aperture is provided (hereinbelow referred to as a ring-shaped aperture plate) and the plate on which the circular aperture is provided (hereinbelow referred to as a circular aperture plate). The inner portion and the outer portion of the ring-shaped aperture are of the same potential. With the above relationships, an electric field generated around the ring-shaped aperture brings negative spherical aberration (aberration to back side) to the charged particle beam. A relationship in which positive spherical aberration by the electromagnetic lens is corrected by the negative spherical aberration by the corrector can be achieved. If the outer portion and the inner portion of the ring-shaped aperture can be at the same potential, actual production of the ring-shaped aperture plate becomes enabled. The ring-shaped aperture plate in which the inner portion and the outer portion of the ring-shaped aperture are maintained coaxial by a bridge can be produced by processing a sheet of conductive plate. Further, while it is difficult to apply the potential difference between the inner portion and the outer portion of the ring-shaped aperture, it is easy to apply the potential difference between two plates. The implementation of the device for correcting the spherical aberration using a simple structure is enabled by the finding of a concept of using the ring-shaped aperture plate and the circular aperture plate in combination, and applying the potential difference between these two plates.

It is preferable to apply the potential difference between the incident plate and the emission plate in a state where a plate on a sample side is grounded. Due to this, an influence of the spherical aberration corrector on the sample can be reduced.

Further, it is preferable that the ring-shaped aperture plate is arranged on the sample side. Due to this as well, the influence of the spherical aberration corrector on the sample can be reduced.

It is preferable to use a layered structure in which the incident plate makes tight contact with one surface of an insulative sheet, and the emission plate makes tight contact with another surface of the insulative sheet. If an aperture encompassing the circular aperture is provided on the insulative sheet, the potential difference can be applied between the incident plate and the emission plate, and a beam path passing through the ring-shaped aperture and the circular aperture can be secured.

Further, the aforementioned layered body is preferably housed in an insulative cylinder. Work for adjusting the ring-shaped aperture and the circular aperture in a coaxial positional relationship and maintaining them as such can be simplified.

It is preferable that a bridge connecting an outer portion and an inner portion of the ring-shaped aperture is provided on a plate on which the ring-shaped aperture is provided. A number of the bridge is not particularly limited. If the outer portion, the bridge, and the inner portion are constituted as an integrated object, the ring-shaped aperture plate can be produced as described later herein.

It is preferable that a circular aperture plate side end surface of the bridge is shifted in a direction separating away from the circular aperture plate than a circular aperture plate side end surface of the ring-shaped aperture plate configuring the outer portion and the inner portion of the ring-shaped aperture. Due to this, spherical aberration correction accuracy is improved.

The aforementioned corrector is preferably fixed to a member detachably attached to a through hole provided on a lens barrel through which the charged particle beam passes. The lens barrel of an electron microscope is provided with a through hole for inserting or withdrawing a sample into or out of the lens barrel, or a through hole for inserting or withdrawing a measurement jig, a stop, or the like into or out of the lens barrel. In a structure that keeps a position of the spherical aberration corrector in the lens barrel by making use of such a through hole, spherical aberration of a conventional device can be corrected.

Among members detachably attached to the through hole, there are ones that can be fixed to the lens barrel at two or more positions. In this case, plural correctors may be fixed to the member which allows selecting the spherical aberration corrector to be actually used.

A through hole may be provided at a center of the inner portion that provides the ring-shaped aperture. When such a through hole is provided at the center, the centers of the circular aperture and the ring-shaped aperture can easily be adjusted to the positional relationship in which they are positioned on the center line of the charged particle beam.

Details and further improvements of the corrector will be described in the DESCRIPTION OF EMBODIMENTS below.

DESCRIPTION OF EMBODIMENTS

Some of primary features of embodiments described herein will be listed.

(Feature 1) A ring-shaped aperture is formed on a metal plate by radiating converged ion beam thereon.

(Feature 2) The ring-shaped aperture is formed on a molybdenum plate by radiating converged ion beam thereon.

(Feature 3) A through hole is provided on a lens barrel of an electron microscope, and a spherical aberration corrector is attached to a holder that can be detachably attached to this through hole, (Feature 4) A magnitude of a voltage applied to the spherical aberration corrector can be adjusted.

Embodiments

Figure 1:
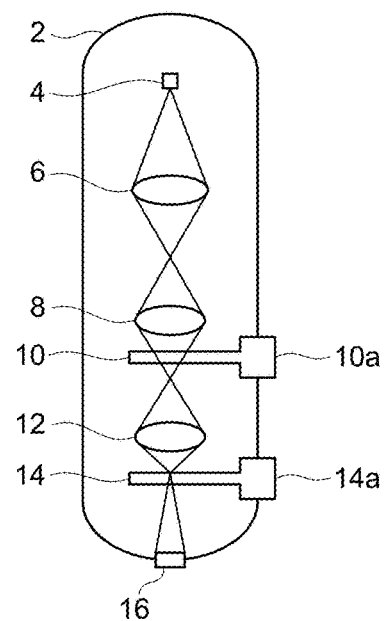
FIG. 1 shows a configuration of a scanning transmission electron microscope that incorporates a spherical aberration corrector of an embodiment.

FIG. 1 schematically shows a configuration of a scanning transmission electron microscope (STEM) assembled with a spherical aberration corrector 10. Reference numeral 2 is a lens barrel, 4 is an electron gun, 6 is a first condenser lens (electromagnetic lens), 8 is a second condenser lens (electromagnetic lens), 10 is a spherical aberration corrector, 12 is an object lens (electromagnetic lens), 14 is a sample, and 16 is a detector. Depiction of a scan coil for polarizing and scanning electron beam is omitted. All of the condenser lenses 6, 8 and the object lens 12 are electromagnetic lenses.

If the spherical aberration corrector 10 is not inserted, spherical aberration is generated at a convergent point by the object lens 12, and a beam diameter cannot be narrowed down on the sample 14. The spherical aberration corrector 10 enables to reduce the spherical aberration generated at the convergent point of the object lens 12 and to narrow down the beam diameter radiated on the sample 14.

The present embodiment may be applied to a case in which spherical aberration by the condenser lenses 6, 8 can be ignored, and the spherical aberration by the object lens 12 is a primary factor reducing measurement resolution, and may also be applied to a case in which spherical aberration generated by a combination of the condenser lenses 6, 8 and the object lens 12 reduces the measurement resolution. In the former case, the spherical aberration corrector 10 can be designed for the object lens 12, and for the latter case, the spherical aberration corrector 10 can be designed for the combination of the condenser lenses 6, 8 and the object lens 12. As will be described later, a voltage to be applied to the spherical aberration corrector 10 is adjustable, and a magnitude of the voltage changes intensity of correction on the spherical aberration. If a voltage by which the clearest image can be obtained is applied, spherical aberration that degrades observation quality can be corrected. According to the spherical aberration corrector 10 of the embodiment, there is no need to specify which electromagnetic lens is causing the spherical aberration that degrades the observation quality. Further, the spherical aberration corrector 10 of the embodiment can be applied without having a restriction by types of the electromagnetic lenses that bring the spherical aberration that degrades the observation quality.

Figure 2:
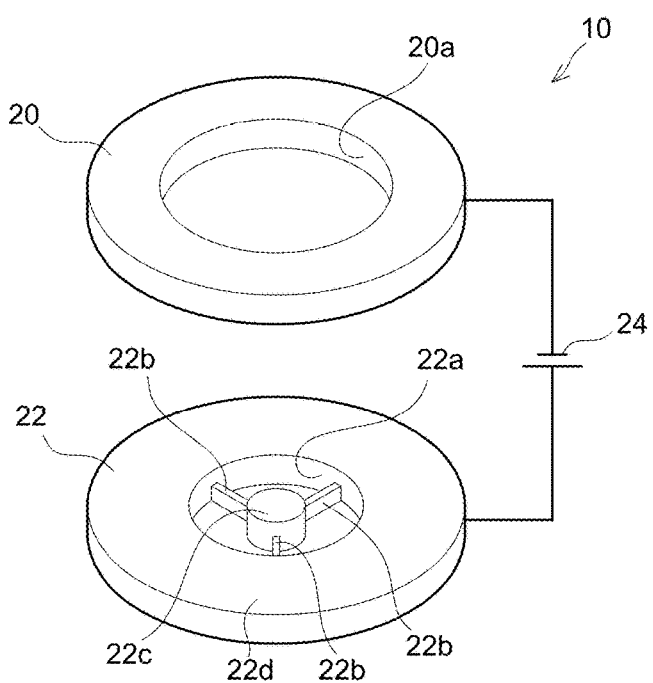
FIG. 2 schematically shows a configuration of the spherical aberration corrector of the embodiment.

FIG. 2 shows a perspective view of an example of the spherical aberration corrector 10. A reference numeral 20 is an electrode plate on which a circular aperture 20a is provided (conductive circular aperture plate), and 22 indicates an electrode plate on which a ring-shaped aperture 22a is provided (conductive ring-shaped aperture plate). 22b are bridges, which connect an inner circular plate 22c and an outer ring plate 22d that constitute the ring-shaped aperture 22a. The inner circular plate 22c and the outer ring plate 22d may be of a same potential (unlike the conventional technique, no potential difference needs to be applied between the inner circular plate 22c and the outer ring plate 22d), and the inner circular plate 22c, the outer ring plate 22d, and the bridges 22b can be produced by processing a conductive metal plate.

The spherical aberration corrector 10 shown in FIG. 2 is for electron beam charged with negative charges, in which case a relationship "the potential of the ring-shaped aperture plate 22>the potential of the circular aperture plate 20" is employed. If spherical aberration of particle beam charged with positive charges is to be corrected, as in a case of positive ion radiation, a relationship "the potential of the ring-shaped aperture plate 22<the potential of the circular aperture plate 20" is employed.

Figure 3:
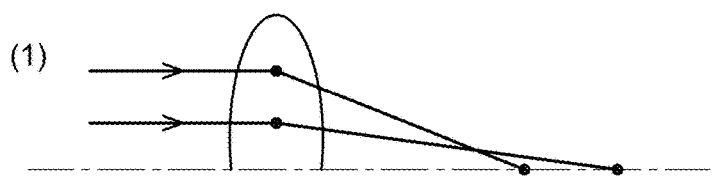
FIG. 3 explains spherical aberration and correction thereof.
Figure 3:
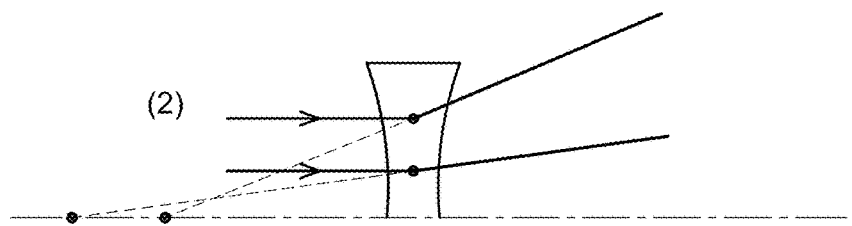
Figure 3:
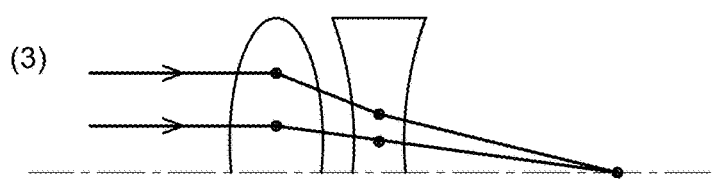
Figure 3:
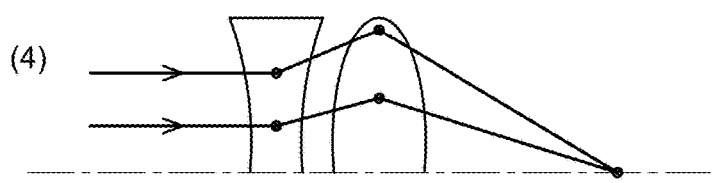

FIG. 3 (1) shows spherical aberration generated by a convex lens constituted of optical glass. Positive spherical aberration (aberration to forth side) is generated by the convex lens. FIG. 3 (2) shows spherical aberration generated by a concave lens constituted of optical glass. Negative spherical aberration (aberration to back side) is generated by the concave lens. FIG. 3 (3) and (4) show examples of optical systems that correct the spherical aberration by combinations of the convex and concave lenses.

An electromagnetic lens that changes a progressing direction of charged particles brings the positive spherical aberration shown in FIG. 3 (1). With an electromagnetic lens, negative spherical aberration shown in FIG. 3 (2) cannot be achieved.

Figure 4:
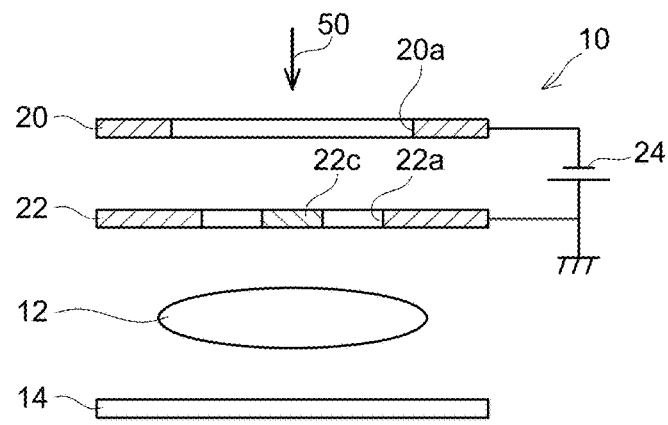
FIG. 4 shows an example of an arrangement of a spherical aberration corrector and an electromagnetic lens.

FIG. 4 shows an example in which the spherical aberration corrector 10 is arranged on an upstream side of the object lens 12. The spherical aberration corrector 10 is configured of the circular aperture plate 20 provided with the circular aperture 20a, the ring-shaped aperture plate 22 provided with the ring-shaped aperture 22a, and a constant voltage power supply 24 configured to apply a voltage between the plates. Centers of the circular aperture 20a and the ring-shaped aperture 22a are on a center line 50 of the charged particle beam, and the plates 20, 22 intersect the center line 50 perpendicularly. The plates 20, 22 are arranged coaxially.

Figure 7:
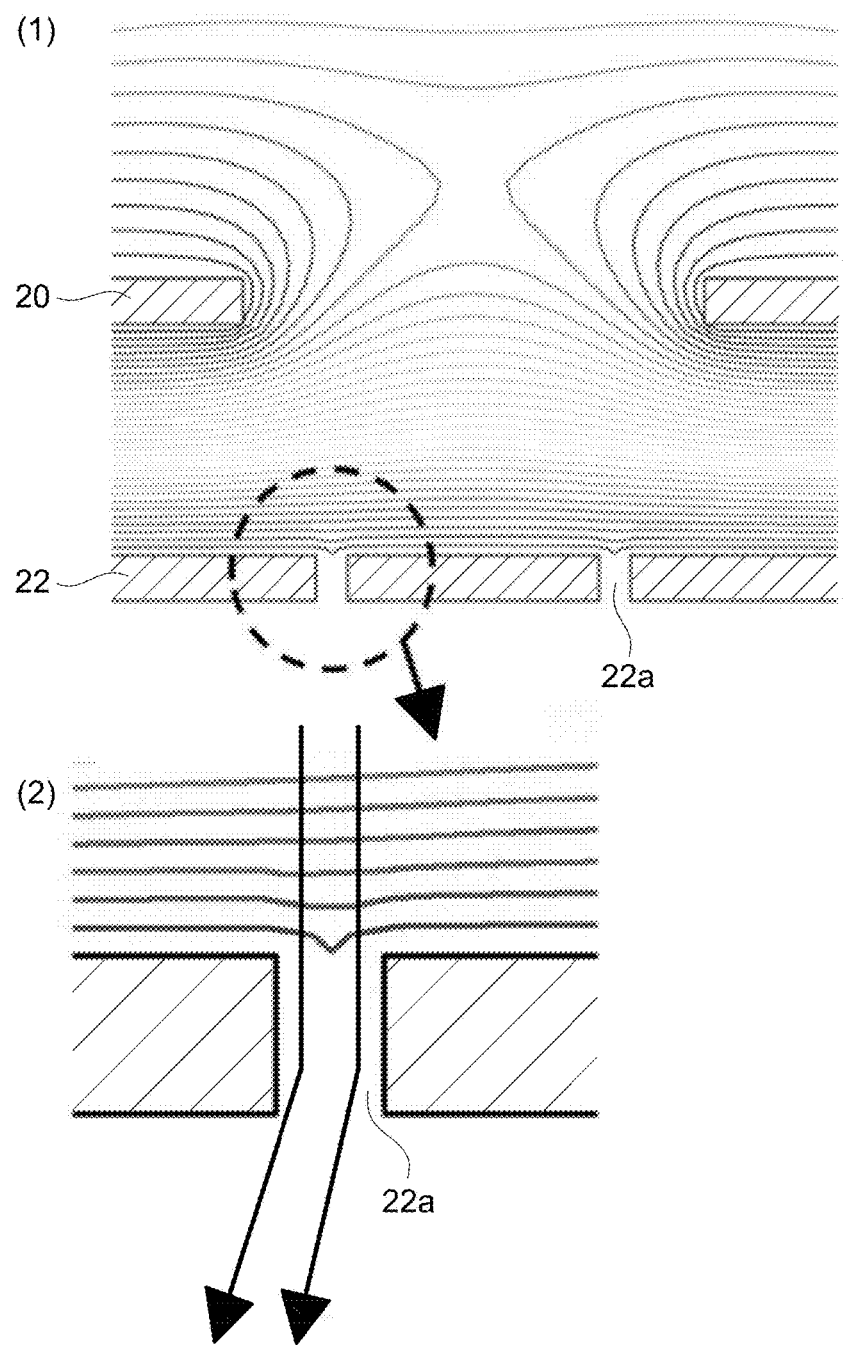
FIG. 7 shows an example of a relationship between an electric field of the spherical aberration corrector and a progressing direction of electron beam.

FIG. 7 (1) shows an electric field generated between the circular aperture plate 20 and the ring-shaped aperture plate 22 when a relationship "a potential of the ring-shaped aperture plate 22>a potential of the circular aperture plate 20" is employed. Specifically, it shows equipotential lines. FIG. 7 (2) shows a shape of the equipotential lines in a vicinity of the ring-shaped aperture 22a by enlarging them. As shown in FIG. 7 (2), the equipotential lines bend in the vicinity of the ring-shaped aperture 22a. When the electron beam passes through this electric field, negative spherical aberration is generated in the electron beam. More accurately, the electric field in a vicinity of the circular aperture plate 20 behaves similar to that of a convex lens. The electric field in the vicinity of the ring-shaped aperture plate 22 behaves similar to that of a concave lens. As a result of these two electric field behaviors being composed, the spherical aberration corrector 10 brings negative spherical aberration.

Figure 8:
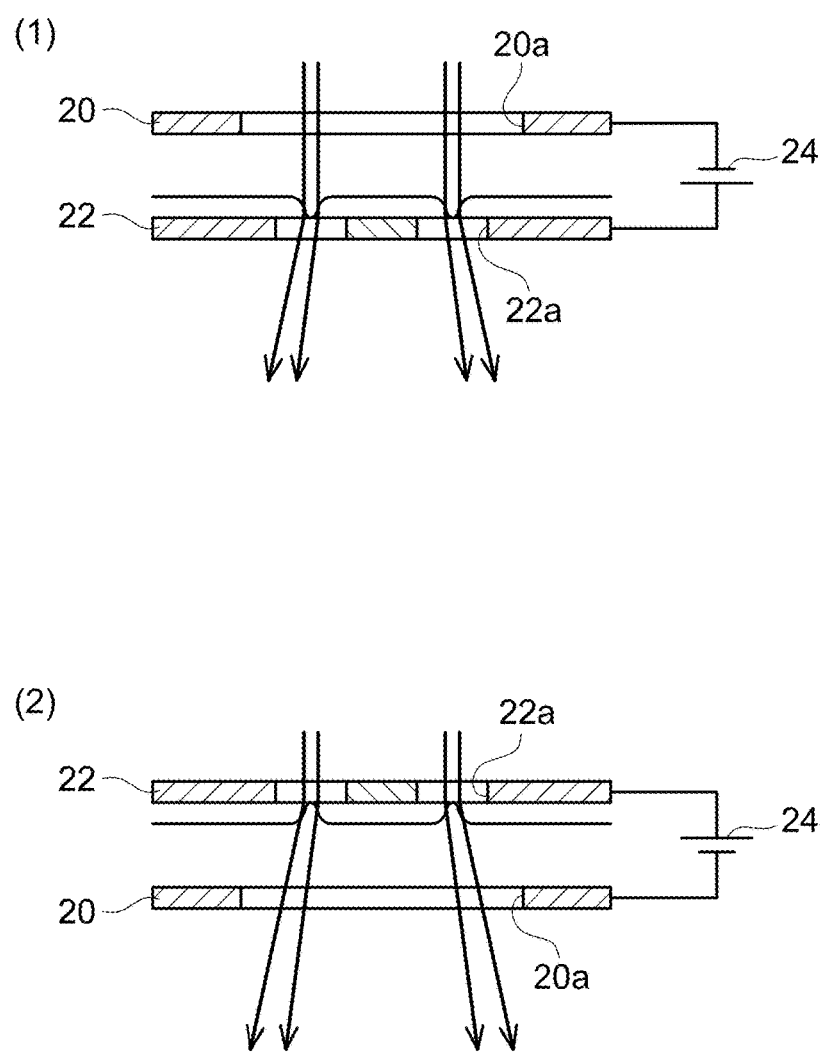
FIG. 8 shows other examples of the relationships between the spherical aberration corrector and the progressing direction of the electron beam.

FIG. 8 (1) shows the progressing direction of the electron beam passing through the spherical aberration corrector 10, and shows that negative spherical aberration is generated.

In case of FIG. 4, the electron beam refracts upon passing through the spherical aberration corrector 10 and is subjected to the negative spherical aberration. The electromagnetic lens 12 for the electron beam brings the positive spherical aberration. In the case of FIG. 4, it can be understood that the negative spherical aberration generated by the spherical aberration corrector 10 establishes a relationship that it corrects the positive spherical aberration generated by the object lens 12. It can be confirmed that the spherical aberration is corrected according to the relationship shown in FIG. 3 (4).

As it is apparent from FIG. 3 (3), the electromagnetic lens may be arranged on the upstream side, and the spherical aberration corrector may be arranged on a downstream side.

Figure 5:
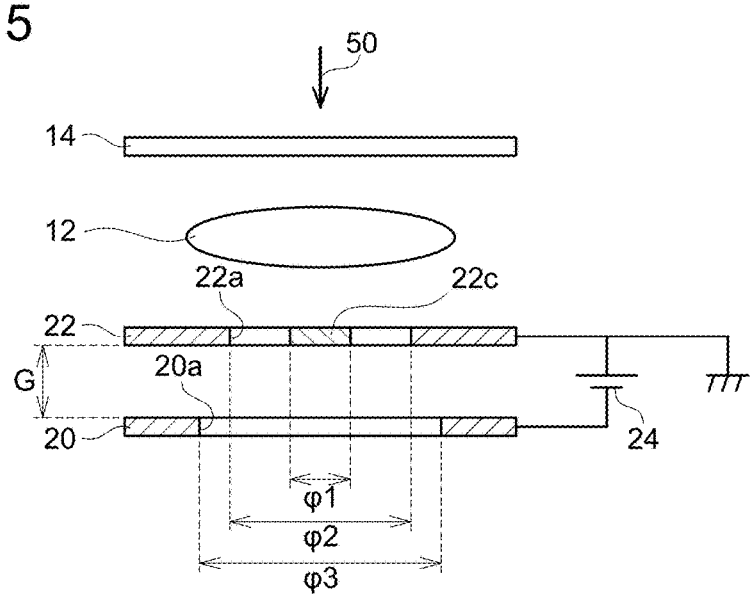
FIG. 5 shows another example of the arrangement of the spherical aberration corrector and the electromagnetic lens.

FIG. 5 shows such an example. FIG. 5 corresponds to a case of a transmission electron microscope that generates an image by the object lens 12 from the electron beam having passed through the sample 14.

As shown in FIGS. 4 and 5 or FIG. 3 (3) and (4), the arrangement order of the spherical aberration corrector 10 and the electromagnetic lens 12 is not limited, and the spherical aberration corrector 10 may be on the upstream side, or the electromagnetic lens may be on the upstream side. Further, in a case of correcting spherical aberration brought forth by a combination of plural electromagnetic lenses, the spherical aberration corrector may be arranged in between the plural electromagnetic lenses.

Further, as shown in FIG. 8 (1), the circular aperture 20a may be on the upstream side while the ring-shaped aperture 22a is on the downstream side, or alternatively as shown in FIG. 8 (2), the ring-shaped aperture 22a may be on the upstream side while the circular aperture 20a is on the downstream side. In either of the cases, the negative spherical aberration is exhibited for the negatively-charged particle beam if the relationship: the potential of the ring-shaped aperture plate 22>the potential of the circular aperture plate 20 is employed. In a case of the positively charged particle beam, the negative spherical aberration is exhibited therefor if a relationship: the potential of the ring-shaped aperture plate 22<the potential of the circular aperture plate 20 is employed. The aforementioned relationships of potential magnitudes apply all the same for the case where the circular aperture 20a is on the upstream side and the case where the ring-shaped aperture 22a is on the upstream side.

Figure 6:
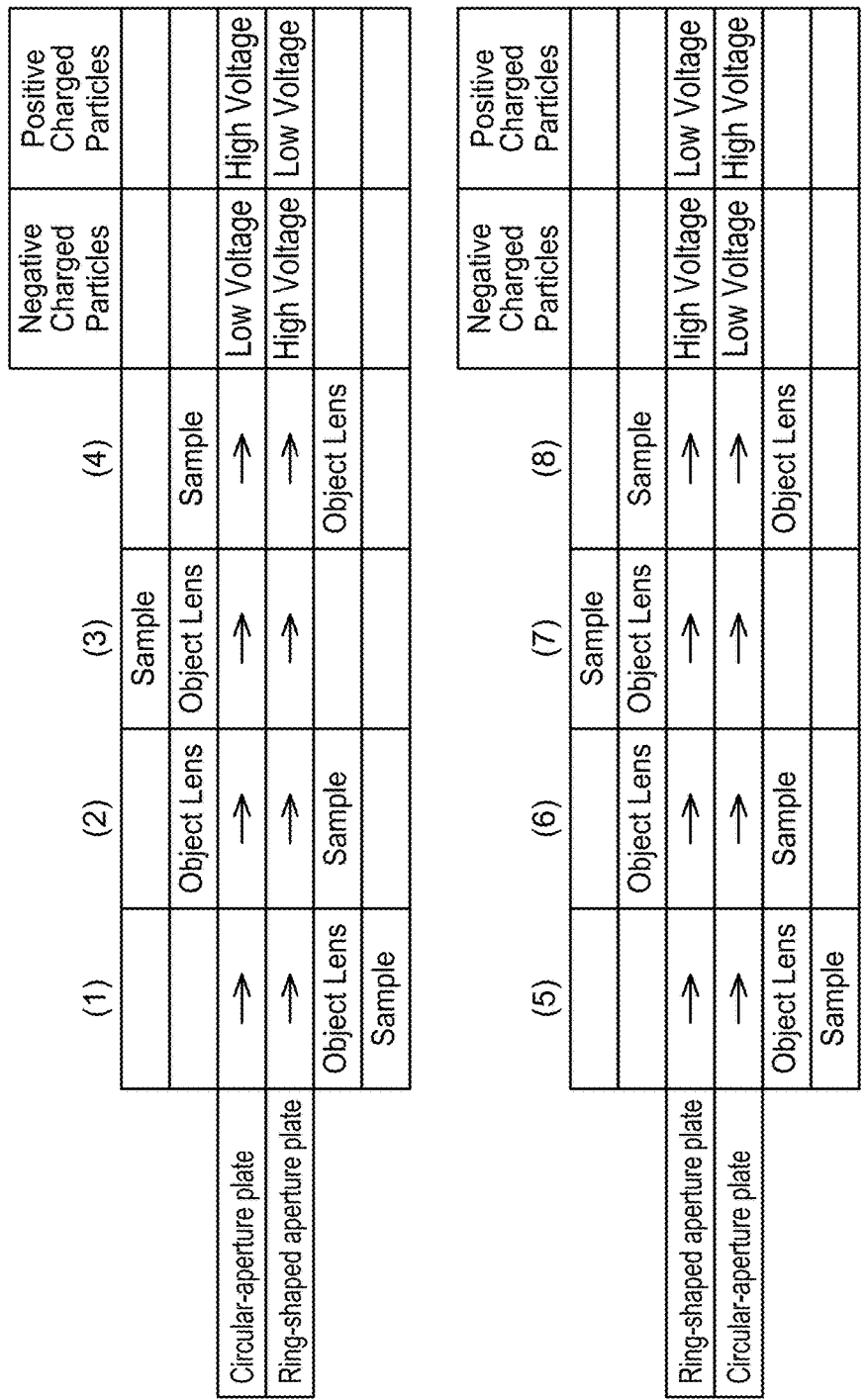
FIG. 6 shows arrangement relationships between the spherical aberration corrector and the electromagnetic lens.

FIG. 6 shows examples of variations of the arrangement relationship of the ring-shaped aperture plate, the circular aperture plate, and the electromagnetic lens. Upper side of FIG. 6 means the upstream side, and lower side means the downstream side. (1) to (4) show cases where the circular aperture 20a is on the upstream side and the ring-shaped aperture 22a is on the downstream side, and (5) to (8) show cases where the ring-shaped aperture 22a is on the upstream side and the circular aperture 20a is on the downstream side. (1), (2), (5), and (6) show cases of a STEM (Scanning Transmission Electron Microscope) that radiates beam converged by an object lens, and (3), (4), (7), and (8) show cases of a transmission electron microscope that forms an image by an object lens from beam that had passed through a sample. As shown in (1), (4), (5), and (8), the spherical aberration corrector may be on the upstream side and the object lens may be on the downstream side, or as shown in (2), (3), (6), and (7), the object lens may be on the upstream side and the spherical aberration corrector may be on the downstream side.

In either of the arrangement orders in FIG. 6, the spherical aberration can be cancelled out and diminished, however, in actual implementation, it is preferable to arrange the object lens and the sample into proximity, and as such, (1), (3), (5), and (7) are preferable. Further, it is preferable that an electric field of the spherical aberration corrector does not affect the sample, and as such, it is preferable to arrange the ring-shaped aperture plate on a sample side. In this regard, (1), (2), (7), and (8) are preferable. In considering both factors, (1) and (7) are preferable. FIG. 4 corresponds to FIG. 6 (1), and FIG. 5 corresponds to FIG. 6 (7).

Further, a relationship of the potential difference applied to a circular aperture plate and a ring-shaped aperture plate is shown in FIG. 6. It is preferable to ground the plate that is to be arranged on the sample side. In the cases of (1) and (7), it is preferable to ground the ring-shaped aperture plate 22, and apply a negative potential to the circular aperture plate 20 for negative charged particles.

Figure 9:
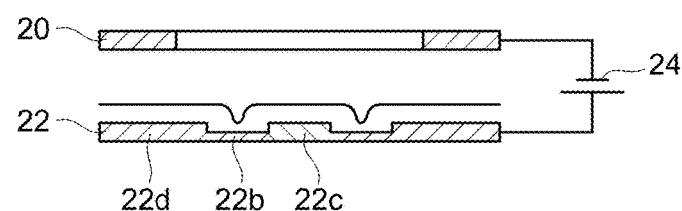
FIG. 9 shows a relationship between the electric field of the spherical aberration corrector and bridges.

FIG. 9 shows a cross section of the ring-shaped aperture plate 22 at a portion where the bridges 22b are present. As it is apparent from FIG. 9, circular aperture plate 20-side end surfaces of the bridges 22b are preferably shifted toward a direction separating away from the circular aperture plate 20 than a circular aperture plate 20-side end surface of the ring-shaped aperture plate 22 that constitutes an outer portion 22d and an inner portion 22c of the ring-shaped aperture. Due to this, differences of an electric field shape between portions where the bridges 22b are present and portions where the bridges 22b are absent can be reduced, and correction accuracy of the spherical aberration can be improved.

As shown in FIG. 5, it is preferable that $\varphi3 \geq \varphi2 > \varphi1$ is satisfied, where a diameter of the circular aperture 20a is $\varphi3$, an outer diameter of the ring-shaped aperture 22a is $\varphi2$, and an inner diameter of the ring-shaped aperture 22a is $\varphi1$. When the above relationship is satisfied, the negative spherical aberration required for the corrector can be exhibited, and further, the charged particle beam does not need to be cut unnecessarily.

In the present embodiment, a device with dimensions of: $\varphi3=225$ μm, $\varphi2=150$ μm, $\varphi1=54.4$ μm, and inter-plate gap G=0 μm, and a device with dimensions of: $\varphi3=100$ μm, $\varphi2=68$ μm, $\varphi1=54.4$ μm, and inter-plate gap G=50 μm were produced. The circular aperture plate 20 was manufactured by photolithography method. The ring-shaped aperture plate 22 was produced by radiating converged ion beam onto a molybdenum plate having a diameter of 3 mm and a thickness of 10 μm. The inner portion 22c, the outer portion 22d, and the bridges 22b of the ring-shaped aperture plate are constituted from a single piece of molybdenum plate, and it was possible to produce them by fine processing techniques. If the inner portion 22c and the outer portion 22d of the ring-shaped aperture need to be insulated, they could not be easily produced even with the latest technology.

Figure 10:
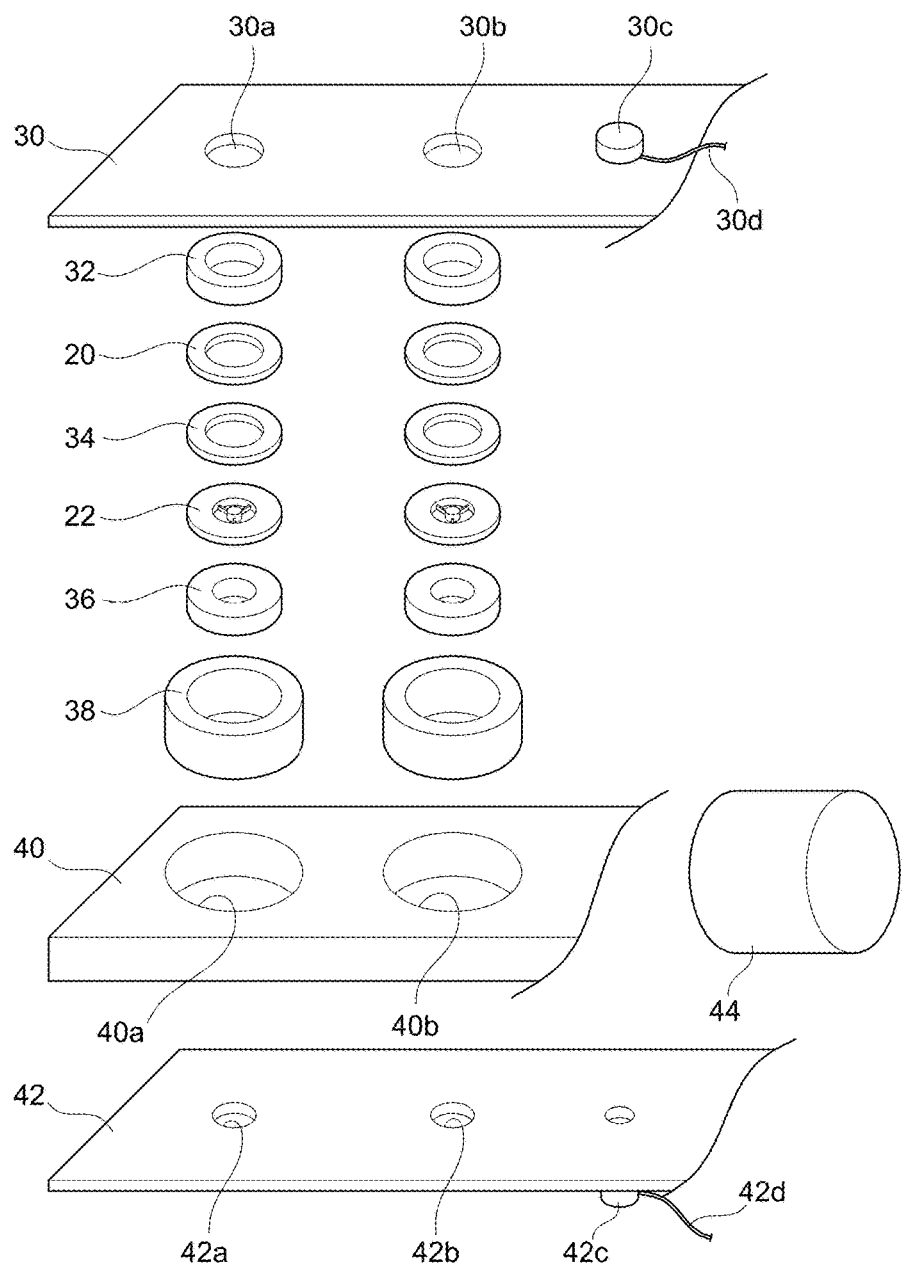
FIG. 10 shows a disassembled perspective view of spherical aberration correctors of an embodiment.

FIG. 10 shows a disassembled perspective view of actual spherical aberration correctors 10. In this embodiment, two spherical aberration correctors are installed. Configurations of the left and right spherical aberration correctors are identical, so duplicated explanations will be omitted.

Reference numeral 42 is a lower plate, and 40 is a middle plate, which has holes 40a, 40b, each housing cylindrical insulative guide 38 to be described later. The lower plate 42 and the middle plate 40 may be configured integrally. 38 are cylindrical insulative guides, each of which is provided with a hole that positions the circular aperture plate 20 and the ring-shaped aperture plate 22 to be coaxial by receiving the circular aperture plate 20 and the ring-shaped aperture plate 22. 36 are conductive spacers, 22 are ring-shaped aperture plates, 34 are insulative sheets, 20 are circular aperture plates, 32 are electrode holders, and 30 is an upper plate. The upper plate 30, the electrode holders 32, and the insulative sheets 34 each have a hole that is larger than the diameter ($\varphi3$ of the circular aperture 20a but smaller than the outer diameter of the circular aperture plate 20. The spacer 36 has a hole and the lower plate 42 has holes 42a, 42b. Each of these holes is larger than the outer diameter $\varphi2$ of the ring-shaped aperture 22a but smaller than the outer diameter of the ring-shaped aperture plate 22. Outer diameters of the electrode holders 32, the circular aperture plates 20, the insulative sheets 34, the ring-shaped aperture plates 22, and the spacers 36 are equal to an inner diameter of the insulative guides 38, and when they are inserted into the corresponding insulative guide 38, the electrode holder 32, the circular aperture plate 20, the insulative sheet 34, the ring-shaped aperture plate 22, and the spacer 36 align coaxially. When the upper plate 30 and the lower plate 42 are brought closer by screws not shown, the circular aperture plate 20 makes tight contact with an upper surface of the insulative sheet 34, the ring-shaped aperture plate 22 makes tight contact with a lower surface of the insulative sheet 34, and a gap between the circular aperture plate 20 and the ring-shaped aperture plate 22 is adjusted to a certain value.

The upper plate 30 and the middle plate 40 are insulated from one another by an insulative member that is not shown. A voltage is applied to the upper plate 30 by a wiring 30d, and a different voltage is applied to the lower plate 42 from a wiring 42d. The electrode holders 32 are electrically conductive, so the potential of the circular aperture plates 20 is equal to a potential of the wiring 30d. The spacers 36 are electrically conductive, so the potential of the ring-shaped aperture plates 22 is equal to a potential of the wiring 42d. The potentials of the inner circular plates 22c and the outer ring plates 22d of the ring-shaped aperture plates 22 are equal. The circular aperture plates 20 and the ring-shaped aperture plates 22 are insulated by the insulative sheets 34 and the insulative guides 38.

Reference numeral 44 is a base portion of the middle plate 40. The spherical aberration correctors are for an electron microscope, of which lens barrel is provided with a through hole, and using this through hole, a "stop" can be inserted therein and withdrawn therefrom. A stop holder that is to be detachably attached to the through hole is prepared. The base portion 44 is fixed to this stop holder. Reference numeral 10a in FIG. 1 shows the stop holder. Voltages that are required for the wirings 30d and 42d can be applied from outside the lens barrel through the stop holder 10a. Further, the potential difference to be applied can be adjusted.

The stop holder 10a can be fixed to the lens barrel 2 at a position where it is inserted shallowly into the lens barrel 2, or can be fixed to the lens barrel 2 at a position where it is inserted deeply into the lens barrel 2. In connection hereto, the embodiment of FIG. 10 is installed with two types of correctors. The corrector to be used can be selected by selecting an insertion depth into the lens barrel.

Figure 11:
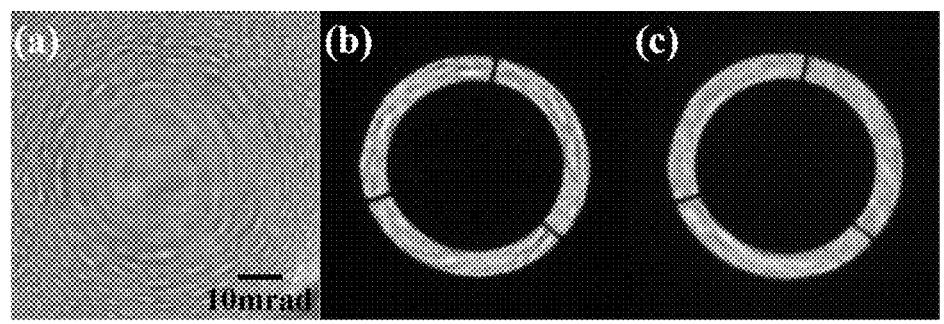
FIG. 11 shows observation results by the scanning transmission electron microscope.

FIG. 11 shows an observation result by the scanning transmission electron microscope shown in FIG. 1. The sample is gold fine particles on a carbon thin film. A CCD camera is used for the detector 16.

(a) shows a case where the spherical aberration corrector 10 is not used, and gold particles that are extended and warped can be observed at its peripheral portion. Warped portions are caused by the spherical aberration.

(b) shows the observation result of a state in which, although the spherical aberration corrector 10 is installed, no potential is applied between the circular aperture plate and the ring-shaped aperture plate. Shadow of the ring-shaped aperture 22a is generated. Further, the spherical aberration is not yet corrected.

(c) shows the observation result of a case where 15 volts is applied between the circular aperture plate and the ring-shaped aperture plate. Contrast of the gold particles is reduced, and it can be confirmed that the spherical aberration has been corrected.

Figure 12:
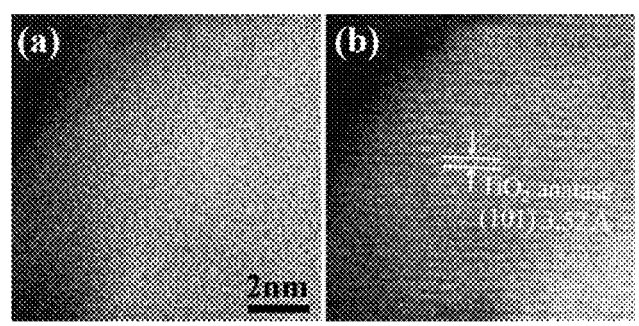
FIG. 12 shows observation results by the scanning transmission electron microscope.
Figure 13:
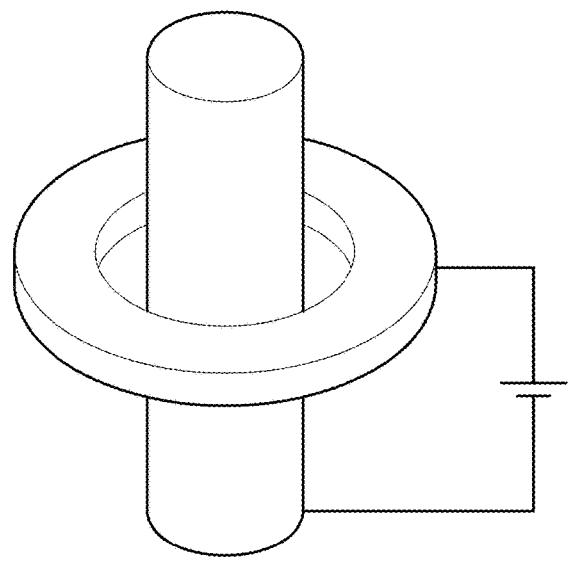
FIG. 13 schematically shows configurations of conventional spherical aberration correctors.
Figure 13:
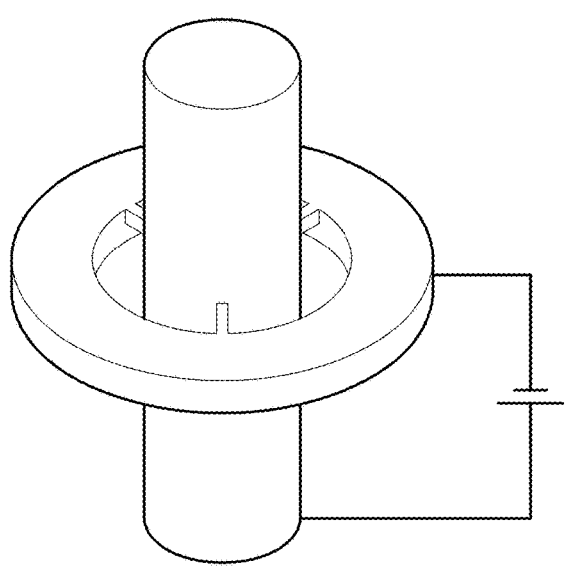

FIG. 12 shows observation results of titanium oxide fine particles on a carbon thin film. The electron beam to be radiated on the sample is scanned, and a micro-detector is used instead of a camera. (a) shows the observation result of a case where no potential is applied between the circular aperture plate and the ring-shaped aperture plate. The observation result is blurred. (b) shows the observation result of a case where 15 volts is applied between the circular aperture plate and the ring-shaped aperture plate. Atomic lattice structures of titanium oxide crystals are clearly shown. It can be confirmed that the spherical aberration has been corrected.

The generation of the negative spherical aberration by the electric field generated by the application of the potential difference between the ring-shaped aperture plate and the circular aperture plate has been confirmed by numeric calculation and in experiment as well. Also the correction of the positive spherical aberration caused by the electromagnetic lens by the aforementioned negative aberration has been confirmed by the numeric calculation and in experiment as well.

The application of the potential difference between the ring-shaped aperture plate and the circular aperture plate and the application of the potential difference between the inner portion and the outer portion of the ring-shaped aperture plate may seem similar. In order to obtain negative spherical aberration, an electric field that varies in a radial direction is required, and in the light of reasonable consideration, it can be understood that a potential difference needs to be applied between the inner portion and the outer portion of the ring-shaped aperture plate. The concept that the negative spherical aberration can be achieved by the application of the potential difference between the ring-shaped aperture plate and the circular aperture plate has long rested unfound. Further, the concept of making this technology implementable by such an improvement has long been unrecognized.

Figure 14:
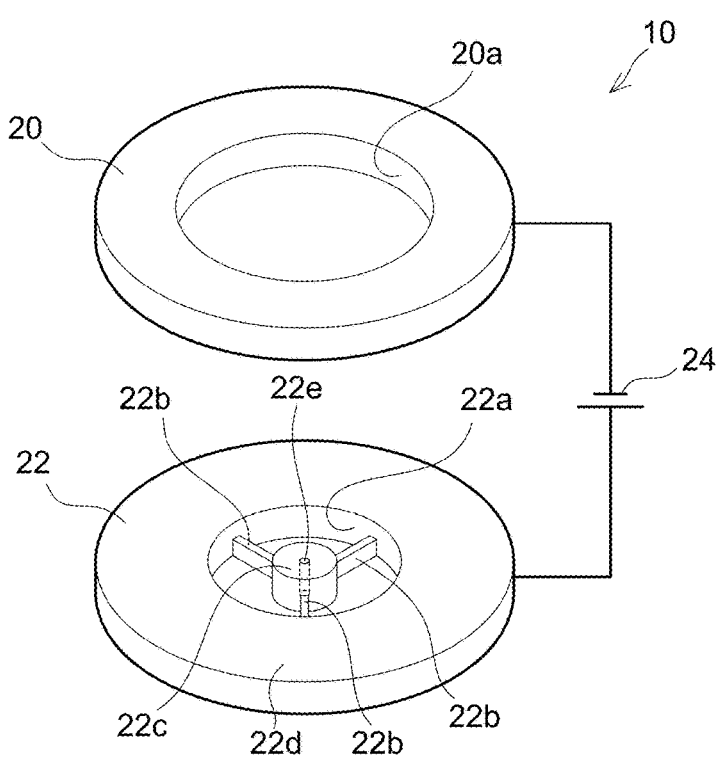
FIG. 14 schematically shows a configuration of a modification of the spherical aberration corrector.
Figure 15:
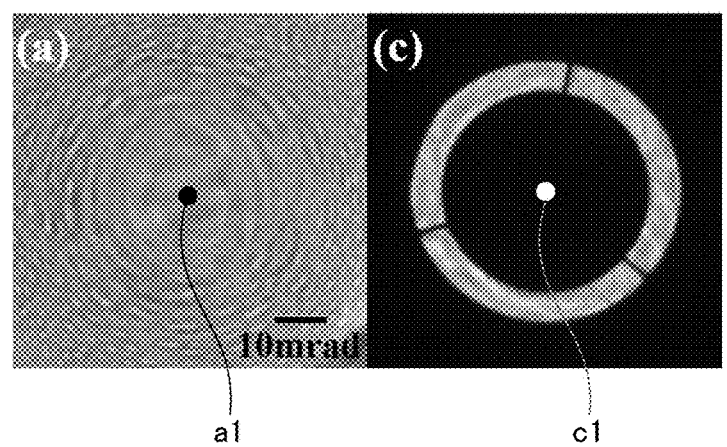
FIG. 15 explains how a positional relationship adjusting procedure is simplified.

As shown in FIG. 14, a through hole 22e may be provided at a center of the inner circular plate 22c of the ring-shaped aperture plate 22. When the central through hole 22e penetrating along an axis is provided, as shown in FIG. 15 (c), a bright point "c1" appears on an observed image. This bright point "c1" is generated by electrons having passed the central through hole 22e. With the achievement of the bright point "c1", the bright point "c1" can be matched with a center "a1" of the image of FIG. 15 (a) to align the center of the ring-shaped aperture 22a and the canter of the circular aperture 20a on the center line of the electron beam. By providing the central through hole 22e, work for positioning the center of the ring-shaped aperture 22a and the center of the circular aperture 20a on the center line of the electron beam becomes extremely easy. It should be noted that the spherical aberration generated in the electron beam used for the observation will be corrected despite the presence of the central through hole 22e.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGN LIST

2: Lens Barrel
4: Electron Gun
6: Condenser Lens
8: Condenser Lens
10: Corrector
12: Object Lens
14: Sample
16: Detector
20: Circular aperture plate
20a: Circular Aperture
22: Ring-shaped aperture plate
22a: Ring-shaped Aperture
22b: Bridge
22c: Inner Circular Plate (Inner Portion)
22d Outer Ring Plate (Outer Portion)
22e: Central Through Hole
24: Constant Voltage Power Supply
50: Center Line of Charged Particle Beam

The invention claimed is:

1. A corrector to be used in combination with an electromagnetic lens for charged particle beam to correct spherical aberration generated by the electromagnetic lens, the corrector comprising:
an incident plate arranged on an incident side of the charged particle beam; and
an emission plate arranged on an emission side of the charged particle beam,
wherein
one of a circular aperture and a ring-shaped aperture is provided on the incident plate,
another of the circular aperture and the ring-shaped aperture is provided on the emission plate,
(1) centers of the circular aperture and the ring-shaped aperture are on a center line of the charged particle beam,
(2) the incident plate and the emission plate intersect perpendicularly to the center line,
(3) $\varphi 3 \geq \varphi 2 > \varphi 1$ is satisfied, where a diameter of the circular aperture is $\varphi 3$, an outer diameter of the ring-shaped aperture is $\varphi 2$, and an inner diameter of the ring-shaped aperture is $\varphi 1$,
(4) when the charged particles are of negative charge, a potential of a plate on which the ring-shaped aperture is provided is higher than a potential of a plate on which the circular aperture is provided, and when the charged particles are of positive charge, the potential of the plate on which the ring-shaped aperture is provided is lower than the potential of the plate on which the circular aperture is provided, and
an inner portion and an outer portion of the ring-shaped aperture are configured to be electrically conducted.

2. The corrector according to claim 1, wherein the emission plate is grounded.

3. The corrector according to claim 1, wherein the ring-shaped aperture is provided on the emission plate.

4. The corrector according to claim 1, wherein
the incident plate makes tight contact with one surface of an insulative sheet,
the emission plate makes tight contact with another surface of the insulative sheet, and
an aperture encompassing the circular aperture is provided on the insulative sheet.

5. The corrector according to claim 4, wherein the incident plate, the insulative sheet, and the emission plate are housed in an insulative cylinder.

6. The corrector according claim 1, wherein
a bridge connecting the outer portion and the inner portion of the ring-shaped aperture is provided on a plate on which the ring-shaped aperture is provided, and
the outer member, the bridge, and the inner portion are integrated as one component.

7. The corrector according to claim 6, wherein the ring-shaped aperture is provided on the emission plate, and an incident-side end surface of the bridge is shifted toward the emission side than an incident-side end surface of the plate constituting the outer portion and the inner portion.

8. The corrector according to claim 1, wherein a through hole is provided at a center of the inner portion of the ring-shaped aperture plate.

9. A device in which the corrector according to claim 1 is fixed to a member that is detachably attached to a through hole provided in a lens barrel through which the charged particle beam passes.

10. The device according to claim 9, wherein
the member detachably attached to the through hole is configured fixable to the lens barrel at plural positions, and
a plurality of the corrector is fixed to the member at positions corresponding to the plural positions.

* * * * *